(12) United States Patent
Camras et al.

(10) Patent No.: US 6,784,463 B2
(45) Date of Patent: *Aug. 31, 2004

(54) III-PHOSPIDE AND III-ARSENIDE FLIP CHIP LIGHT-EMITTING DEVICES

(75) Inventors: Michael D. Camras, Sunnyvale, CA (US); Daniel A. Steigerwald, Cupertino, CA (US); Frank M. Steranka, San Jose, CA (US); Michael J. Ludowise, San Jose, CA (US); Paul S. Martin, Pleasanton, CA (US); Michael R. Krames, Mountain View, CA (US); Fred A. Kish, San Jose, CA (US); Stephen A. Stockman, Morgan Hill, CA (US)

(73) Assignee: Lumileds Lighting U.S., LLC, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/095,552

(22) Filed: Mar. 11, 2002

(65) Prior Publication Data

US 2002/0093023 A1 Jul. 18, 2002

Related U.S. Application Data

(63) Continuation-in-part of application No. 09/732,326, filed on Dec. 6, 2000, now Pat. No. 6,570,190, which is a continuation of application No. 08/868,009, filed on Jun. 3, 1997, now Pat. No. 6,229,160.

(51) Int. Cl.$^7$ .............................................. H01L 33/00

(52) U.S. Cl. ........................... 257/99; 257/98; 257/103

(58) Field of Search .............................. 257/95, 98, 99, 257/103, 81, 82, 778

(56) References Cited

U.S. PATENT DOCUMENTS

| 4,369,458 | A | 1/1983 | Thomas et al. ................ 357/30 |
| 4,416,054 | A | 11/1983 | Thomas et al. ................ 29/572 |
| 4,827,290 | A | 5/1989 | Yoritomo et al. ........ 346/107 R |
| 5,060,027 | A | 10/1991 | Hart et al. ..................... 357/17 |
| 5,376,580 | A | 12/1994 | Kish et al. ................... 437/127 |
| 5,502,316 | A | 3/1996 | Kish et al. ................... 542/210 |
| 5,506,451 | A | 4/1996 | Hyugaji ....................... 257/778 |

(List continued on next page.)

FOREIGN PATENT DOCUMENTS

EP  0 415 541 B1  10/1994

OTHER PUBLICATIONS

G. E. Höfler et al., "Wafer Bonding of 50–mm Diameter GaP to AlGaInP–GaP Light–Emitting Diode Wafers", Appl. Phys. Lett. 69(6), Aug. 5, 1996, pp. 803–805.

(List continued on next page.)

Primary Examiner—Minh-Loan Tran
(74) Attorney, Agent, or Firm—Patent Law Group LLP

(57) ABSTRACT

A light-emitting semiconductor device includes a stack of layers including an active region. The active region includes a semiconductor selected from the group consisting of III-Phosphides, III-Arsenides, and alloys thereof. A superstrate substantially transparent to light emitted by the active region is disposed on a first side of the stack. First and second electrical contacts electrically coupled to apply a voltage across the active region are disposed on a second side of the stack opposite to the first side. In some embodiments, a larger fraction of light emitted by the active region exits the stack through the first side than through the second side. Consequently, the light-emitting semiconductor device may be advantageously mounted as a flip chip to a submount, for example.

56 Claims, 8 Drawing Sheets

U.S. PATENT DOCUMENTS

| | | | |
|---|---|---|---|
| 5,621,225 A | 4/1997 | Shich et al. | 257/81 |
| 5,661,316 A | 8/1997 | Kish, Jr. et al. | 257/190 |
| 5,668,386 A | 9/1997 | Makiuchi et al. | 257/184 |
| 5,757,829 A | 5/1998 | Jiang et al. | 372/31 |
| 5,779,924 A | 7/1998 | Krames et al. | 216/24 |
| 5,780,321 A | 7/1998 | Shich et al. | 438/34 |
| 5,783,477 A | 7/1998 | Kish, Jr. et al. | 438/455 |
| 5,793,062 A | 8/1998 | Kish, Jr. et al. | 257/98 |
| 5,917,202 A | 6/1999 | Haitz et al. | 257/98 |
| 5,923,053 A | 7/1999 | Jakowetz et al. | 257/95 |
| 5,923,951 A | 7/1999 | Goossen et al. | 438/47 |
| 5,940,683 A | 8/1999 | Holm et al. | 438/23 |
| 6,005,262 A | 12/1999 | Cunningham et al. | 257/84 |
| 6,015,719 A | 1/2000 | Kish, Jr. et al. | 438/29 |
| 6,066,862 A | 5/2000 | Chang et al. | 257/103 |
| 6,111,272 A | 8/2000 | Heinen | 257/94 |
| 6,221,683 B1 | 4/2001 | Nirschi et al. | 438/47 |
| 6,222,207 B1 | 4/2001 | Carter-Coman et al. | 257/98 |
| 6,229,160 B1 | 5/2001 | Krames et al. | 257/94 |
| 6,287,947 B1 | 9/2001 | Ludowise et al. | 438/606 |
| 6,307,218 B1 | 10/2001 | Steigerwald et al. | 257/99 |
| 6,458,612 B1 | 10/2002 | Chen et al. | 438/29 |
| 6,462,358 B1 | 10/2002 | Lin et al. | 257/99 |
| 6,492,661 B1 | 12/2002 | Chien et al. | 257/98 |

OTHER PUBLICATIONS

"UEC unvails new wafer–bonded AlInGaP LED structure", CS–Max Conference Report, Compound Semiconductor, Sep. 2001. p. 51.

R. H. Horng et al, "Wafer Bonding of 50–mm–Diameter Mirror Substrates to AlGaInP Light–Emitting Diode Wafers", Journal of Electronic Materials, vol. 30, No. 8, 2001, pp 907–910.

Co–pending application entitled: "Phosphor Converted Light Emitting Diode", Ser. No. 09/827382, filed on Apr. 14, 2001, 30 pages including drawings.

Co–pending application entitled: "Led Having Angled Sides For Increased Sid Light Extraction", Ser. No. 09/732326, filed on Dec. 6, 2000, 32 pages including drawings.

Co–pending application entitled: "Multi–Layer Highly Reflective Ohmic Contacts for Semiconductor Devices", Ser. No. 09/469652, filed on Dec. 22, 1999, 19 pages including drawings.

Co–pending application entitled: "III–Nitrate Light–Emitting Device With Increased Light Generating Capability", Ser. No. 09/469657, filed on Dec. 22, 1999, 48 pages including drawings.

Co–pending application entitled: "Light Emitting Diodes with Improved light Extraction Efficiency", Ser. No. 09/660317, filed on Sep. 12, 2000, 37 pages including drawings.

Co–pending application entitled: "Monolithic Series/Parallel Led Arrays Formed on Highly Resistive Substrates", Ser. No. 09/823824, filed on Mar. 29, 2001, 23 pages including drawings.

Gordon Elger et al., "Development of an Low Cost Wafer Level Flip Chip Assembly Process for High Brightness LED Using the AuSn Metallurgy", Fraunhofer Institute for Reliability and Microintegration, Berling, Germany, 6 pages, no date.

us 6,784,463 B2

III-PHOSPIDE AND III-ARSENIDE FLIP CHIP LIGHT-EMITTING DEVICES

CROSS REFERENCE TO RELATED APPLICATIONS

This is a continuation in part of U.S. patent application Ser. No. 09/732,326 filed on Dec. 6, 2000, which is a continuation of U.S. patent application Ser. No. 08/868,009 filed on Jun. 3, 1997, now U.S. Pat. No. 6,229,160. U.S. patent application Ser. No. 09/732,326 and U.S. Pat. No. 6,229,160 are incorporated herein by reference in their entirety.

FIELD OF THE INVENTION

The present invention relates to light-emitting devices, and more particularly to III-Phosphide and III-Arsenide based semiconductor light-emitting devices having improved light generating capability.

BACKGROUND

III-Phosphide and III-Arsenide material systems are suitable for the fabrication of light-emitting devices that generate light having photon energies which range, respectively, from the green to the red spectral wavelength regimes and from the red to the infrared wavelength regimes. III-Phosphide material systems include any combination of group III and group V elements with phosphorous. Example III-Phosphide materials include, but are not limited to, AlP, GaP, InP, AlGaP, GaInP, AlGaInP, GaInPN, and GaInAsP. III-Arsenide material systems include any combination of group III and group V elements with arsenic. Example III-Arsenide materials include, but are not limited to, AlAs, GaAs, InAs, AlGaAs, GaInAs, AlGaInAs, GaInAsN, GaAsSb, and GaInAsP.

III-Phosphide and III-Arsenide based light-emitting devices such as light-emitting diodes and laser diodes may be employed in a variety of applications such as street lighting, traffic signals, and liquid crystal display backlighting. In such applications, it is advantageous to increase the flux (optical energy/unit time) provided by an individual light-emitting device. Unfortunately, the flux provided by conventional III-Phosphide and III-Arsenide based light-emitting devices can be limited by their conventional vertical geometry.

Referring to FIG. 1, for example, a typical conventional III-Phosphide or III-Arsenide light-emitting device 10 includes a III-Phosphide or III-Arsenide active region 12 disposed between an n-type conductive substrate 14 and p-type layer 16. P-contact 18 and n-contacts 20 are disposed on opposite sides of device 10. A suitable forward voltage applied across contact 18 and contacts 20 causes current to flow vertically through p-type layer 16, active region 12, and conductive substrate 14, and thereby causes active region 12 to emit light.

Typically, the flux provided by conventional light-emitting device 10 is reduced because a portion of the light generated in active region 12 is absorbed by conductive substrate 14. In some prior art devices light generated in active region 12 and incident on substrate 14 is absorbed because the band gap energy of substrate 14 is less than the photon energy of the generated light. In other prior art devices, in which the band gap of substrate 14 is greater than the photon energy of the generated light, substrate 14 still absorbs a portion of the generated light incident on it due to absorption by free-carriers in the substrate. These free-carriers, typically generated by dopants, are necessary to support electrical conduction through substrate 14 between contact 18 and contacts 20.

Conductive substrate 14 is sometimes wafer bonded to the rest of conventional light-emitting device 10. The resulting wafer bonded interface lies somewhere between contact 18 and contact 20, and hence must be highly electrically conductive if the device is to operate efficiently. This conductivity requirement limits the material choices for the substrate. Also, the relative crystallographic orientations of the substrate and the device layer to which it is wafer bonded may be critically important to achieving low forward bias voltages (as explained in U.S. Pat. Nos. 5,66,316 and 5,783,477, both of which are incorporated herein by reference in their entirety). This complicates the manufacturing process for these devices. In addition, a conventional light-emitting device 10 having a wafer bonded substrate may also include additional layers adjacent to the wafer bonded interface in order to improve the interface's electrical properties. Unfortunately, these additional layers can absorb light emitted by active region 12.

Some conventional light-emitting devices include layers which form a distributed Bragg reflector (DBR) located between active region 12 and absorbing substrate 14. In these devices, some of the light emitted by active region 12 is redirected away from substrate 14 by the DBR. Thus, loss due to absorption in substrate 14 is reduced. The reflectivity of the DBR, which is angle dependent, typically decreases for angles away from normal incidence. Consequently, the DBR typically does not reduce absorption in substrate 14 as much as desired.

The placement of contact 18 on top of conventional light-emitting device 10, opposite from contacts 20, also limits the flux provided by device 10. In particular, contact 18 typically either absorbs light generated in active region 12, or reflects it toward absorbing substrate 14. Moreover, contact 18 is typically electrically connected to a package or a submount with a wire bond. Such wire bonds, which can be mechanically fragile and may not handle large electrical currents, also limit the maximum flux that a conventional device can provide.

In addition, active region 12 is typically separated by substrate 14 from any heat sink on which conventional device 10 is mounted. Consequently, heat generated in or near active region 12 may not be effectively dissipated and the performance of conventional device 10 is degraded.

What is needed are III-Phosphide and III-Arsenide based light-emitting devices that do not suffer from the drawbacks of prior art devices.

SUMMARY

A light-emitting semiconductor device includes a stack of layers including an active region. The active region includes a semiconductor selected from the group consisting of III-Phosphides, III-Arsenides, and alloys thereof. A superstrate substantially transparent to light emitted by the active region is disposed on a first side of the stack. First and second electrical contacts electrically coupled to apply a voltage across the active region are disposed on a second side of the stack opposite to the first side. In some embodiments, a larger fraction of light emitted by the active region exits the stack through the first side than through the second side. Consequently, the light-emitting semiconductor device may be advantageously mounted as a flip chip to a submount, for example.

A method of forming a light-emitting semiconductor device in one embodiment includes forming a structure including a stack of semiconductor layers overlying a host substrate, attaching a superstrate to a first side of the structure, removing at least a portion of the host substrate, and forming a first and a second electrical contact on a second side of the structure opposite to the first side. The stack of semiconductor layers includes an active region comprising a semiconductor selected from the group consisting of III-Phosphides, III-Arsenides, and alloys thereof. The superstrate may be attached to structure, for example, by bonding it to the stack or by growing it on the stack using conventional growth techniques. Consequently, the light-emitting semiconductor device may include a bonded interface and may include one or more bonding layers. The superstrate may be attached to the structure either before or after the host substrate is at least partially removed. The superstrate may be attached to the side of the structure from which the host substrate was at least partially removed, or to the side of the structure opposite to that of the host substrate.

The superstrate may be shaped to enhance the efficiency with which light is extracted from the device. A lens may be attached to the superstrate or the superstrate may be formed into a lens to further enhance light extraction efficiency.

Both the light extraction efficiency and the operating power level of light-emitting semiconductor devices disclosed herein may exceed those of conventional III-Phosphide based and III-Arsenide based light-emitting semiconductor devices. Hence, the disclosed light-emitting semiconductor devices may provide higher flux than conventional devices.

Also disclosed is an array of light-emitting semiconductor devices. Each of the light-emitting semiconductor devices comprises a stack of semiconductor layers including an active region, a superstrate disposed on a first side of the stack and substantially transparent to light emitted by the active region, and first and second electrical contacts disposed on a second side of the stack opposite to the first side. The light-emitting devices may be mounted as flip chips to a common substrate (such as a printed circuit board, for example) either directly or via submounts. The active regions of at least a subset of the light-emitting semiconductor devices include a semiconductor selected from the group consisting of III-Phosphides, III-Arsenides, and alloys thereof.

BRIEF DESCRIPTION OF THE DRAWINGS

It should be noted that the dimensions in the figures are not necessarily to scale. Like reference numbers in the various figures denote like parts in the various embodiments.

DETAILED DESCRIPTION

Figure 1:
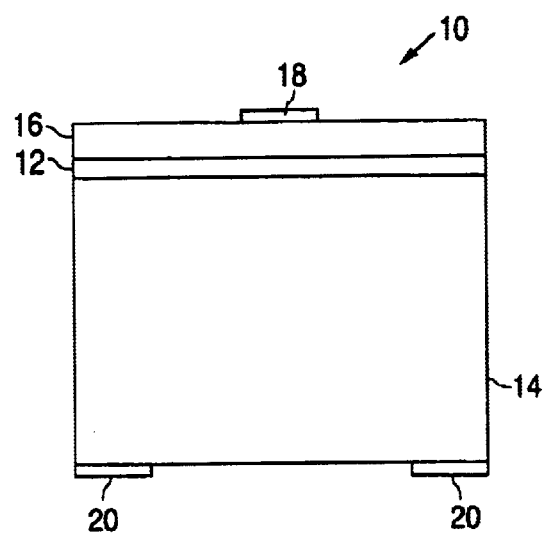
FIG. 1 schematically illustrates a prior art light-emitting-device.

The present invention provides III-Phosphide and III-Arsenide light-emitting devices with improved light extraction and brightness. These devices may be, for example, light-emitting diodes or laser diodes.

In accordance with one embodiment (FIG. 2A), for example, a light-emitting device 100 includes a stack of layers 110 including an active region 112. Active region 112 includes one or more semiconductor layers formed from III-Phosphide or III-Arsenide materials, and may include one or more quantum well layers. The emission wavelengths of light generated in active region 112 may lie, for example, in the visible or infrared regions of the electromagnetic spectrum. The detailed layer structure of active region 112 and the wavelengths of light generated therein are not critical.

Active region 112 is disposed between a first semiconductor region 114 having a first conductivity type and a second semiconductor region 116 having a second conductivity type. Hence, a diode junction is formed in or adjacent to active region 112. Semiconductor regions 114 and 116 may each include one or more semiconductor layers. These semiconductor layers may be undoped or doped either n-type or p-type. In some embodiments, the layers in regions 114 and 116 are formed from III-Phosphide materials, III-Arsenide materials, or from both III-Phosphide and III-Arsenide materials. In other embodiments, the layers in regions 114 and 116 are formed from other semiconductor materials. Semiconductor layers in active region 112 and in regions 114 and 116 may form, for example, a double heterostructure, a single heterostructure, or a homojunction. The detailed layer structure of semiconductor regions 114 and 116 is not critical.

Light-emitting device 100 also includes superstrate 117 disposed on a top side of stack 110 and substantially transparent to light emitted by active region 112. The term "substantially transparent" is used herein to indicate that an optical element so described, such as a substantially transparent superstrate, transmits light at the emission wavelengths of active region 112 with less than about 50%, preferably less than about 20%, single pass loss due to absorption or scattering. One of ordinary skill in the art will recognize that the conditions "less than about 50% loss" and "less than about 20% loss" may be met by various combinations of transmission path length and absorption coefficient.

In the embodiment illustrated in FIG. 2, superstrate 117 has no electrical function. Consequently, the choices for materials from which superstrate 117 may be formed are much less limited than for conventional vertical geometry devices. For example, in the embodiment illustrated in FIG. 2 superstrate 117 may be formed from a substantially non-conducting or highly resistive material. In one implementation, for example, superstrate 117 has a resistivity greater than about 0.05 Ohm-centimeters.

Superstrate 117 may be formed, for example, from suitably transparent semiconductors or dielectric materials. Semiconductors which may be suitable include but are not limited to III-Phosphides (GaP, for example), III-Arsenides (AlGaAs, for example), III-Nitrides (GaN, for example), II–VI semiconductors (ZnS, ZnSe, CdSe, CdTe, for example), SiC, germanium, silicon, and alloys thereof. Dielectric materials which may be suitable include, but are not limited to, diamond, yttrium aluminum garnet (YAG), metal oxides, metal fluorides, optical glasses, and chalcogenide glasses. Other phosphides, arsenides, and nitrides, whether dielectric or semiconducting, may also be suitable for superstrate 117. Example metal oxides which may be suitable include but are not limited to aluminum oxide (sapphire), tungsten oxide, tellurium oxide, titanium oxide, nickel oxide, zirconium oxide (cubic zirconia), indium tin oxide, tin oxide, barium oxide, strontium oxide, calcium oxide, zinc oxide, gallium oxide, antimony oxide, molybdenum oxide, chromium oxide, lead oxide, and bismuth oxide. Example metal fluorides which may be suitable include magnesium fluoride and calcium fluoride. Example optical glasses which may be suitable include but are not limited to Schott glasses SF57, SF59, SFL56, LaSF3, LaSFN9, LaSFN18, and LaSFN30 and Ohara glass PBH71. Example chalcogenide glasses which may be suitable include but are not limited to (Ge,Sb,Ga)(S,Se) glasses.

Since superstrate 117 may be substantially nonconducting or highly resistive, it may be formed from an undoped semiconductor that exhibits little or no free carrier absorption. In one embodiment, for example, superstrate 117 is formed from undoped GaP. The term "undoped" is used herein to indicate that no dopants have been intentionally added to the semiconductor material.

A severe mismatch between the thermal expansion coefficients of superstrate 117 and of stack 110 may cause superstrate 117 to detach from stack 110 upon heating or cooling. Also, approximately matching thermal expansion coefficients reduces the stress induced in stack 110 by superstrate 117. Hence, in some implementations superstrate 117 is formed from a material selected to have a thermal expansion coefficient approximately matching the thermal expansion coefficient of the materials in stack 110. Borosilicate glasses, for example, may be formulated to have coefficients of thermal expansion approximately matching those of III–V semiconductor compounds and hence may be suitable materials for superstrate 117.

The presence of superstrate 117 improves the efficiency with which light is extracted from light emitting device 100 by reducing the fraction of light emitted by active region 112 which is trapped in light-emitting device 100 by total internal reflection at interfaces with the surrounding environment. Both the refractive index and the thickness of superstrate 117 affect this light extraction efficiency. Forming superstrate 117 from a high refractive index material to more closely match the index of stack 110 typically increases the efficiency with which light emitted by active region 112 is coupled from stack 110 into superstrate 117. Consequently, in some implementations superstrate 117 is formed from a material selected to have a refractive index greater than about 1.5, preferably greater than about 1.8, at wavelengths of light emitted by active region 112. In other implementations superstrate 117 may have a refractive index which grades from a high value (greater than about 1.5, preferable greater than about 1.8, for example) near stack 110 to a lower value away from stack 110. In addition, the range of emission angles for which light emitted by active region 112 escapes from light-emitting device 100 increases as superstrate 117 is made thicker. Consequently, superstrate 117 typically has a thickness of, for example, about 25 microns ($\mu$m) to about 1000 $\mu$m. As described below, a relatively thick superstrate also allows the light-emitting device to be shaped to further improve its light extraction efficiency.

Superstrate 117 also provides mechanical strength and stability which allow light-emitting device 100 to be, in some embodiments, a large area device providing a high output flux. In addition, superstrate 117 functions as a heat spreader which smooths the temperature profile in stack 110 and thereby allows light-emitting device 100 to be operated at higher power.

Light-emitting device 100 also includes electrical contacts 118 and 120 configured to apply a voltage across active region 112. Contacts 118 and 120, which are electrically connected to regions of opposite conductivity type in stack 110, are disposed on a bottom side of stack 110 opposite to the (top) side of stack 110 on which superstrate 117 is disposed. Though contacts 118 and 120 are disposed on the same side of stack 110, they are not necessarily (though may be) located at the same height in stack 110 or disposed on the same layer. Layers may be etched away or holes, trenches, or vias may be used to connect one of the contacts.

Contacts 118 and 120 may each include multiple layers of conducting material and may be formed, for example, from gold, silver, nickel, aluminum, titanium, chromium, platinum, palladium, rhodium, rhenium, tungsten, tin, germanium, beryllium, zinc, and alloys thereof. FIG. 2B shows a plan view of electrical contacts 118 and 120 in accordance with one embodiment. In one implementation, solderable metal pads 119 are disposed on contacts 118 and 120 to facilitate electrical connection to contacts 118 and 120 with solder bumps, for example.

Figure 2A:
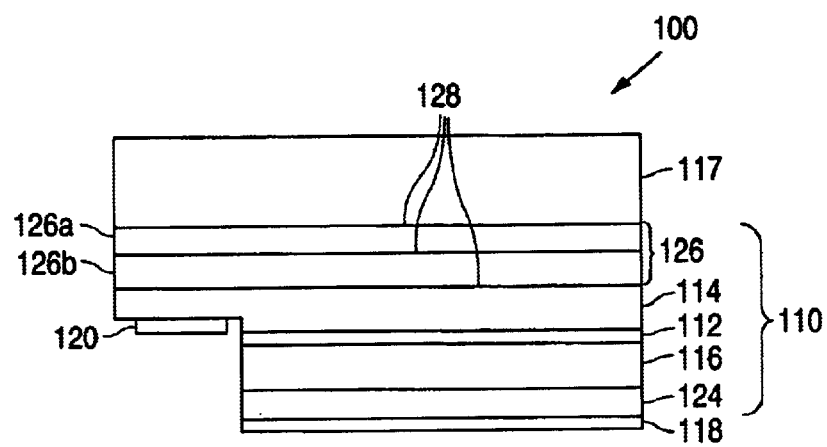
FIGS. 2A–2B schematically illustrate a light-emitting device in accordance with one embodiment.
Figure 2B:
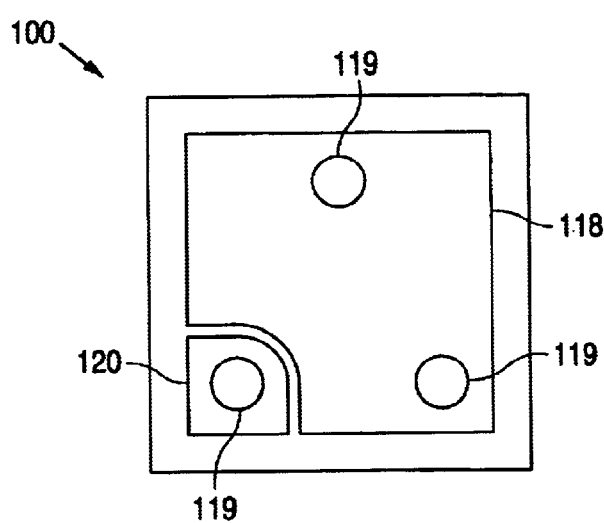

In some embodiments contact 118 is disposed directly on semiconductor region 116, and optional layer 124 shown in FIG. 2A, for example, is not present. In other embodiments contact 118 is spaced apart from semiconductor region 116 by one or more additional layers such as layer 124.

In some embodiments, contact 118 is highly reflective to light emitted by active region 112 and consequently reflects such light incident on it from active region 112 back toward substantially transparent superstrate 117. The term "highly reflective" is used herein to indicate a reflectivity greater than about 50%, preferably greater than about 75%, for light emitted by active region 112. Suitable reflective contacts are disclosed in or substantially similar to contacts disclosed in, for example, U.S. Pat. Nos. 5,917,202, 6,222,207, and 6,287,947, all of which are incorporated herein by reference in their entirety. Suitable reflective contacts are also disclosed in U.S. patent application Ser. No. 09/469,652, assigned to the assignee of the present invention and incorporated herein by reference in its entirety.

Figure 3A:
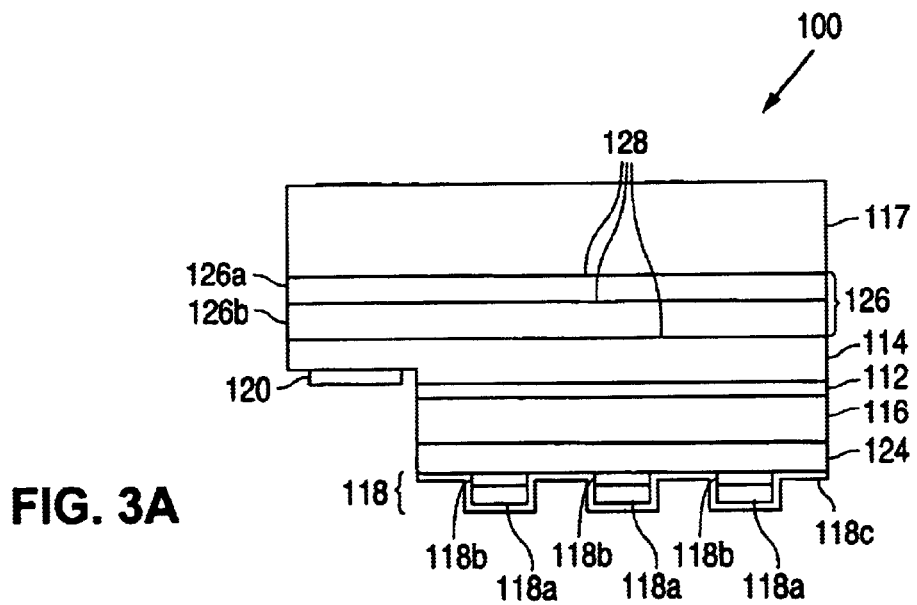
FIGS. 3A–3C schematically illustrate light-emitting devices in accordance with other embodiments.

Ohmic contact between a reflective metal layer and a III-Phosphide or III-Arsenide layer having a high aluminum content, such as a cladding layer, may be difficult to achieve because of the easy formation of aluminum oxides, which tend to insulate the contact. A reflective contact 118 which may be particularly advantageous in such cases is shown in FIG. 3A. In the embodiment illustrated in FIG. 3A, contact 118 includes a plurality of ohmic contacts 118a disposed on a patterned semiconductor layer 118b. A reflective metal layer 118c is disposed on ohmic contacts 118a and on portions of layer 124 not covered by patterned semiconductor layer 118b. In one implementation, patterned semiconductor layer 118b is formed from GaAs, GaInP or very low Al-content AlGaInP, ohmic contacts 118a are formed from gold and germanium or gold and zinc, and reflective metal layer 118c is formed from gold, aluminum, or silver. The GaInP or low Al-content AlGaInP patterned semiconductor layer makes good electrical contact with layer 124 even if layer 124 has a high aluminum content.

The geometry of the pattern of semiconductor layer 118b (and hence of ohmic contacts 118a) depends upon the requirements for current spreading and optical transparency. Since the material in patterned semiconductor layer 118b may absorb light emitted by active region 112, layer 118b should be thin and the surface area of layer 124 covered by layer 118b should be relatively small.

Layer 124 (FIGS. 2A and 3A) may be, for example, a portion of a sacrificial semiconductor substrate used in a method, described below, for fabricating light-emitting device 100. Alternatively, layer 124 may be a layer grown, deposited, or bonded to semiconductor region 116. In embodiments in which region 116 is of p-type conductivity, layer 124 may be, for example, a p-type semiconductor current spreading layer. In other embodiments, layer 124 may be a layer of a material (e.g., a metal) that is highly reflective to light emitted by active region 112. Also, layer 124 may form part of a conventional distributed Bragg reflector disposed between active region 112 and contact 118 to reflect a portion of light emitted by active region 112 toward substantially transparent superstrate 117. Layer 124, if present, may also provide mechanical strength and support for stack 110 during fabrication (bonding or wafer bonding, for example) of light-emitting device 100.

In some embodiments, superstrate 117 is attached to stack 110 with a bonding process during a fabrication method described below. In such embodiments, stack 110 may include one or more optional bonding layers 126 (e.g., 126a and 126b of FIGS. 2A and 3A, for example) disposed between region 114 and superstrate 117. Superstrate 117 may be bonded to one of layers 126 (e.g., 126a), one of layers 126 may be bonded to another one of layers 126, or one of layers 126 (e.g., 126b) may be bonded to semiconductor region 114. One of ordinary skill in the art will recognize that a bonding process (such as a wafer bonding process, for example) may form a bonded interface characterized, for example, by material transfer between bonded layers or, for example, by the formation of a strong bond between lattice-mismatched layers without the formation of lattice defects in the layers characteristic of a lattice-mismatched growth process. Any one of interfaces 128 shown in FIG. 2, for example, may be such a bonded interface. Alternatively, bonding layers 126 may be absent and superstrate 117 may be bonded directly to semiconductor region 114. In the latter case, an interface between superstrate 117 and semiconductor region 114 may be such a bonded interface.

Bonding layers 126 may be formed, for example, from materials chosen to provide a mechanically strong bond and a good optical interface between stack 110 and superstrate 117. Typically, bonding layers 126 are selected to be substantially transparent to light emitted by active region 112. In some implementations, the materials from which layers 126 are formed are selected to have refractive indices greater than about 1.5, preferably greater than about 1.8, at wavelengths of light emitted by active region 112. Also, in some implementations layers 126 have a total thickness less than about 500 Angstroms (Å), preferably less than about 100 Å. Making layers 126 thin and/or forming them from high refractive index materials may reduce optical losses resulting from total internal reflection of light emitted by active region 112 at, for example interfaces 128.

In the embodiment illustrated in FIG. 2A, for example, bonding layers 126 have no electrical function. Consequently, in such embodiments bonding layers 126 and interfaces 128 need not exhibit good electrical conduction and may be highly resistive. Bonding layers 126 may be formed, for example, from suitably transparent semiconductors or dielectric materials. Example semiconductor and dielectric materials which may be suitable for bonding layers 126 include but are not limited to those materials listed above for superstrate 117. Since bonding layers 126 need not be electrically conductive, in some embodiments they may be formed from undoped semiconductor materials that exhibit little or no free carrier absorption. Additional materials which may be suitable for bonding layers 126 include but are not limited to high refractive index organic compounds, organic semiconductors, and metals such as, for example, zinc, indium, magnesium, and tin.

In some embodiments semiconductor region 114 may be absent and superstrate 117 may be conductive (with a conductivity type different from region 116) and may be attached to active region 112 by bonding, for example, either directly or with bonding layers 126. In such cases, contact 120 may be disposed, for example, directly on superstrate 117 and bonding layers 126, if present, would also be conductive. In these embodiments superstrate 117 (and bonding layers 126, if present) would form part of a path through which current flows during operation of light-emitting device 100.

Referring again to the embodiments illustrated in FIGS. 2A and 2B, for example, application of a suitable forward bias across contacts 118 and 120 causes current to flow through semiconductor region 114, active region 112, and semiconductor region 116, and thereby causes active region 112 to emit light. Since contacts 118 and 120 are both disposed on the bottom of stack 110, some of the injected current must flow laterally through semiconductor region 114 if the portion of active region 112 that emits light (and thus the flux provided by device 100) is to be maximized. Such lateral current flow is also necessary in order to provide a spatially uniform current density in active region 112 and thereby provide a desirable spatially uniform light emission intensity. The electrical contact geometry shown in FIGS. 2A and 2B works well for devices having relatively small area (<about 0.2 mm$^2$, for example) active regions. One of ordinary skill in the art would recognize, however, that it can be difficult to achieve such lateral current spreading across large areas, particularly in p-type semiconductor layers. P-type III-Phosphide layers, for example, typically have a high resistivity that limits lateral current flow. Moreover, lateral current spreading generally becomes more difficult with increasing average current density and thus may be difficult for high flux devices.

In conventional vertical geometry light-emitting devices such as device 10 (FIG. 1), lateral spreading of current injected into p-type layer 16 through p-contact 18 is typically enhanced by making layer 16 sufficiently thick. Such a current spreading layer in a conventional vertical geometry device may be, for example, greater than 5 $\mu$m thick. One of ordinary skill in the art would recognize, however, that insertion of such a thick current spreading layer into light-emitting device 100 may make etching steps required during fabrication of light-emitting device 100 difficult, and would be disinclined to insert such a layer. Consequently, one of ordinary skill in the art might expect lateral current spreading to be a problem for a large active area (>about 0.2 mm$^2$, for example) light-emitting device.

The inventors have recognized, however, that sufficient lateral current spreading in a large active area light-emitting device may be provided, for example, by suitably designed contacts 118 and 120. Contact designs that may provide sufficient lateral current spreading in a large active area light-emitting device are disclosed, for example, in U.S.

patent application Ser. No. 09/469,657, U.S. patent application Ser. No. 09/823,824, and in U.S. Pat. No. 6,307,218, all of which are incorporated herein by reference in their entirety.

Figure 3B:
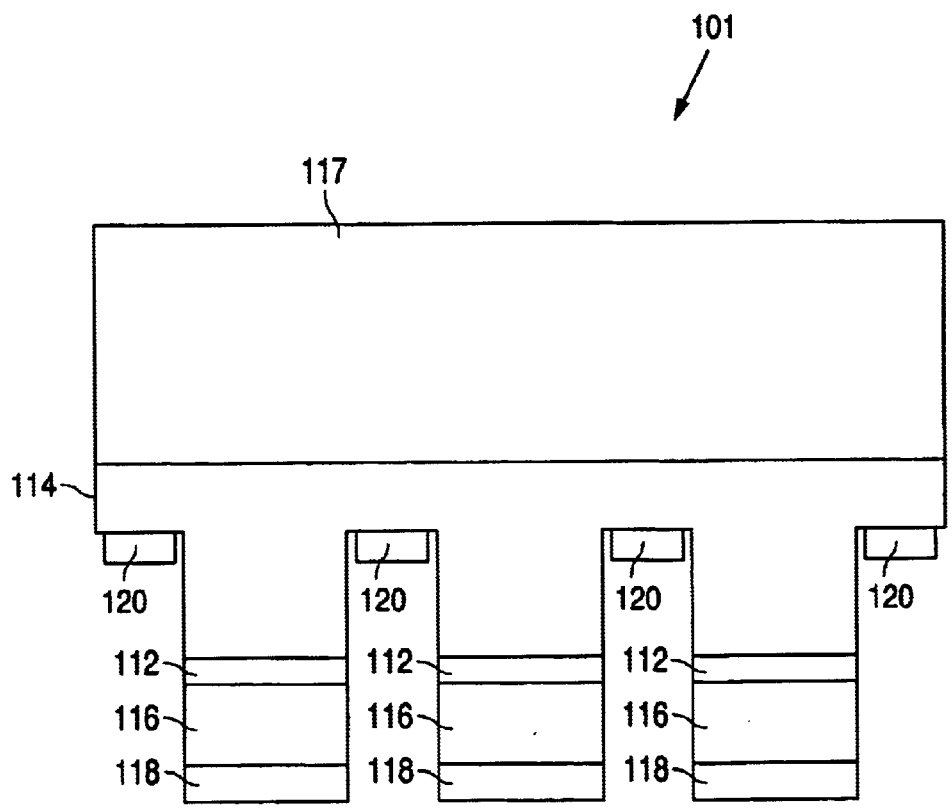
Figure 3C:
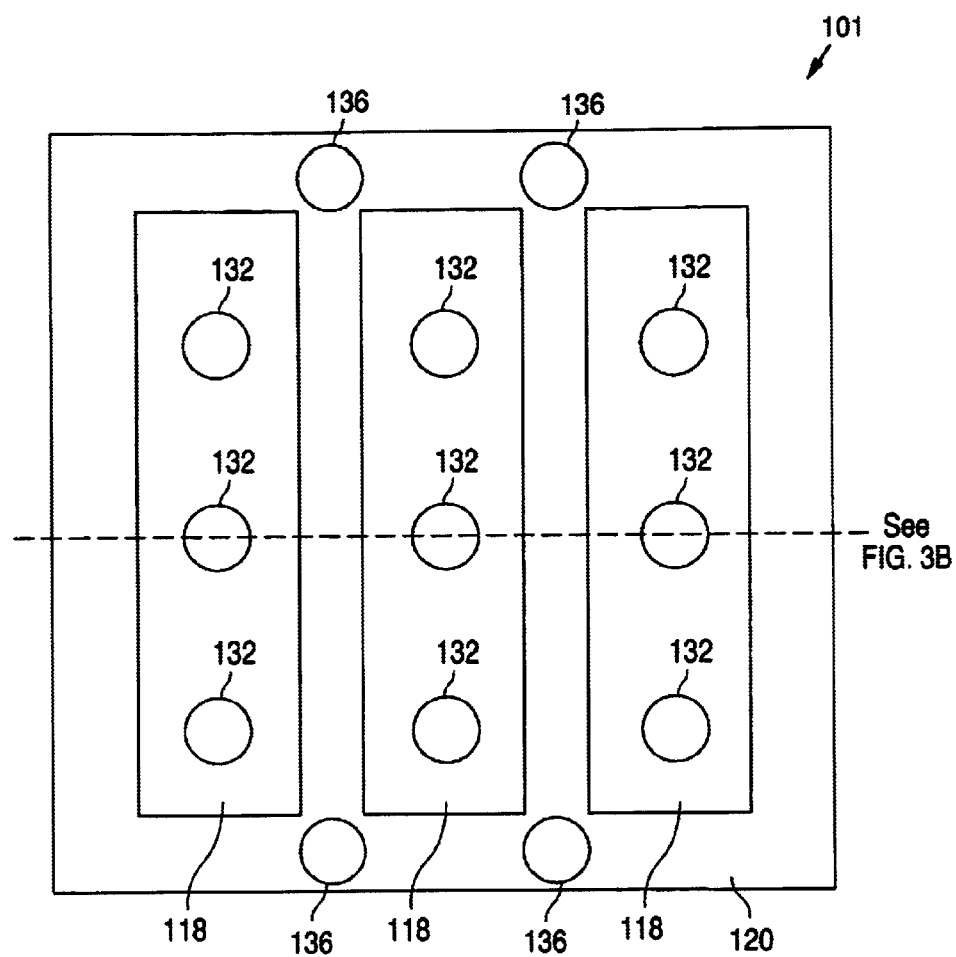

An example contact design that provides enhanced current spreading is implemented in light-emitting device 101 shown in FIG. 3B (cross-sectional view) and in FIG. 3C (plan view). In this embodiment, a plurality of regions 116 of one conductivity type are isolated from each other by a single continuous region 114 of another conductivity type. Contacts 118, each disposed on a separate one of regions 116, are similarly isolated from each other. Continuous contact 120 disposed on region 114 surrounds contacts 118. Contacts 118 and contact 120 may be reflective to light emitted by active regions 112. As discussed below with respect to FIG. 4, solder bumps 132 and 136 shown in FIG. 3C may electrically connect, respectively, contacts 118 and contact 120 to separate electrical contacts or conductive traces on a submount or substrate. Light-emitting device 101 may be viewed as a monolithic array of LED or LD structures electrically coupled in parallel by contact 120. The contact geometry shown in FIGS. 3B and 3C works well for light-emitting devices having active areas greater than about 0.2 mm².

Figure 4:
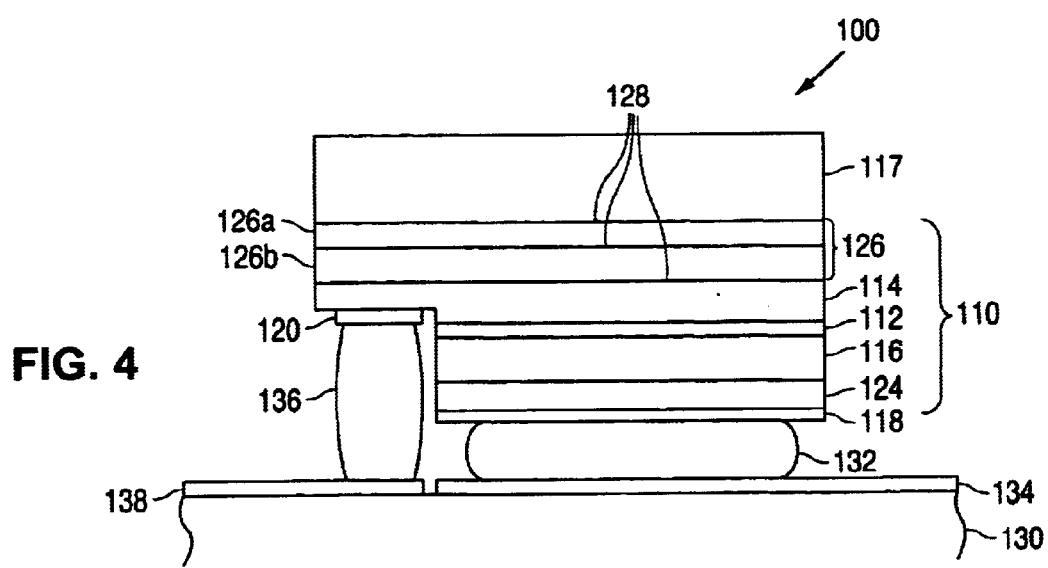
FIG. 4 schematically illustrates a light-emitting device attached to a submount in accordance with another embodiment.

Since contacts 118 and 120 (FIGS. 2A–2B, 3A–3C) are both disposed on the bottom of stack 110, in embodiments in which contacts 118 and 120 are opaque (e.g., reflective), a larger fraction of light emitted by active region 112 exits the stack through its top side into superstrate 117 than through its bottom side. Consequently, light-emitting devices 100 and 101 may be advantageously attached as a flip chip to a submount, for example. Referring to FIG. 4, for example, in one embodiment light-emitting device 100 is attached to a submount 130 and oriented with superstrate 117 facing away from submount 130 and contacts 118 and 120 facing toward submount 130. Solder connection 132 electrically couples contact 118 to contact 134 on submount 130. Solder connection 136 similarly electrically couples contact 120 to contact 138 on submount 130. In this embodiment, light emitted by active region 112 typically exits light-emitting device 100 primarily through superstrate 117. Solder connections 132 and 136 may be formed, for example, with conventional solders or other conductive adhesives. Submount 130 may optionally include additional circuitry such as, for example, circuitry to protect light-emitting device 100 from electrostatic discharges or a photodiode for feedback on LED power output. Suitable circuitry is disclosed, for example, in U.S. patent application Ser. No. 09/859,154 assigned to the assignee of the present invention and incorporated herein by reference in its entirety.

The III-Phosphide and III-Arsenide light-emitting devices disclosed herein may provide numerous advantages in comparison to conventional III-Phosphide and III-Arsenide light-emitting devices, including for high power applications. Superstrate 117 of light-emitting device 100 may be more transparent than substrate 14 of conventional light-emitting device 10 (FIG. 1), for example, since superstrate 117 need not be electrically conductive. This allows the use of higher bandgap semiconductor or dielectric materials which, in addition, need not be doped and thus may exhibit little or no free carrier absorption. In addition, the optical properties of any bonded interfaces in light-emitting device 100 may be optimized, since such interfaces need not be electrically conductive as required in conventional light-emitting device 10. Moreover, in contrast to conventional light-emitting device 10, contacts 118 and 120 are both disposed on the bottom of light-emitting device 100 and thus do not block light emitted by active region 112 from exiting device 100 through superstrate 117. As a consequence of these optical improvements, light may be extracted more efficiently from the light-emitting devices disclosed herein in than from conventional vertical geometry III-Phosphide and III-Arsenide light-emitting devices.

The flip-chip geometry (FIG. 4) in which the disclosed light-emitting devices may be mounted also provides advantages. In particular, the absence of wire bonds and the close proximity of the active region to a submount, for example, (which may act as a heat sink) may allow the disclosed light-emitting devices to operate at higher input powers and with larger area active regions than is practical with conventional III-Phosphide and III-Arsenide light-emitting devices. In some embodiments, for example, the area of active region 112 exceeds 0.2 square millimeters (mm²), 1.0 mm², or 4.0 mm², and the electrical power input to the devices exceeds, respectively, 0.1 Watt (W), 0.5 W, or 2.0 W. The electrical power input to the devices may be further increased for larger active area devices. Consequently, the disclosed light-emitting devices may provide higher flux than conventional III-Phosphide and III-Arsenide light-emitting devices.

Figure 5A:
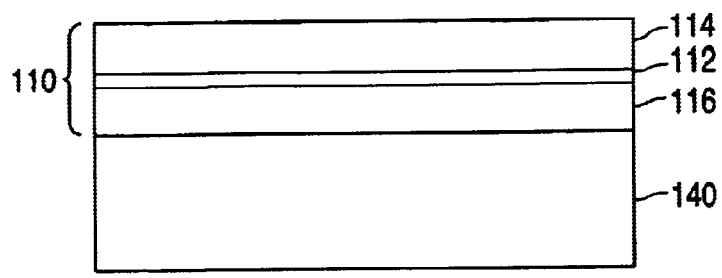
FIGS. 5A–5D schematically illustrate a method of fabricating a light-emitting device in accordance with one embodiment.
Figure 5B:
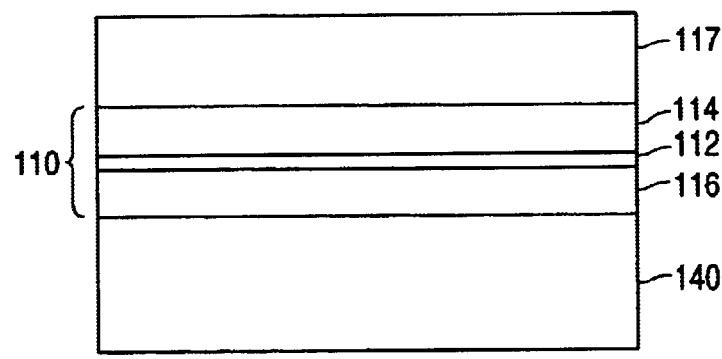
Figure 5C:
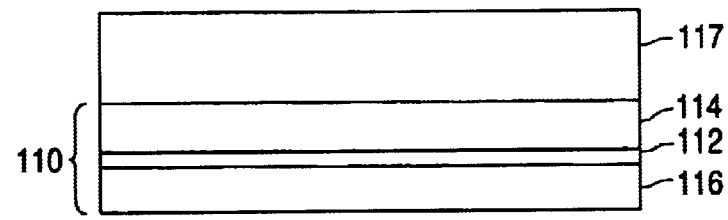

Light-emitting devices such as those disclosed above may be fabricated, for example, by a method illustrated in FIGS. 5A–5D. Referring to FIG. 5A, stack 110 including semiconductor region 114 of a first conductivity type, active region 112, and semiconductor region 116 of a second conductivity type may be grown on a sacrificial host substrate 140 by conventional deposition techniques including but not limited to metal-organic chemical vapor deposition (MOCVD), molecular beam epitaxy (MBE), vapor phase epitaxy (VPE), and liquid phase epitaxy (LPE). Additional layers such as layer 124 and bonding layers 126 shown in FIGS. 2A and 3A may also be formed at this time. Host substrate 140 is typically chosen to provide a lattice matched substrate for the semiconductor layers grown above it. In some embodiments, host substrate 140 is formed from GaAs.

Next (FIG. 5B), superstrate 117 may be attached to stack 110 opposite to host substrate 140 by bonding, for example. In one embodiment, superstrate 117 is bonded to stack 110 by placing superstrate 117 in contact with stack 110, raising the temperature of superstrate 117 and stack 110, and pressing superstrate 117 and stack 110 together. This bonding process may be performed, for example, with a conventional vertical press or with devices disclosed in U.S. Pat. Nos. 5,502,316 and 5,376,580, incorporated herein by reference in their entirety. In some implementations, one or more bonding layers (e.g., layer 126a in FIG. 2) are formed on superstrate 117 before the bonding process is performed. Preferably, the temperature of stack 110 and superstrate 117 is raised to a temperature less than about 1000° C. in order to avoid damaging active region 112 and regions 114 and 116. In some embodiments the bonding process may be performed at advantageously low temperatures, since the resulting bonded interface need not be electrically conducting.

In some embodiments, superstrate 117 is grown on stack 110 using conventional deposition techniques such as, for example, MOCVD, VPE, and LPE. In one embodiment, for example, active region 112 includes a light-emitting layer formed from a III-Arsenide material, and superstrate 117 is formed from an AlGaAs alloy grown on stack 110. In such embodiments, the light-emitting device need not include a bonded interface. In embodiments in which superstrate 117 is grown, an optional composition graded layer may be grown on stack 110 (before the growth of superstrate 117) to enable lattice-matched growth of superstrate 117 despite a lattice mismatch between superstrate 117 and stack 110. The composition of the graded layer varies such that the layer is substantially lattice matched to both stack 110 and superstrate 117. Such a composition graded layer may take the place of bonding layers 126 of FIG. 2A, for example, and is typically selected to be substantially transparent to light emitted by active region 112.

Figure 5D:
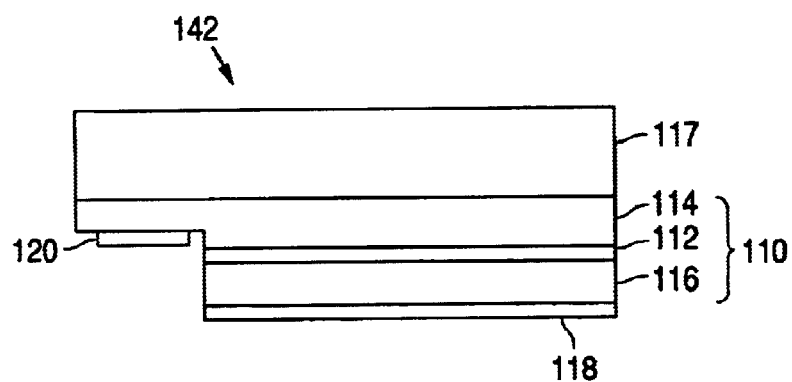

After superstrate 117 has been attached to stack 110, some or all of sacrificial host substrate 140 may be removed (FIG. 5C) by conventional techniques including but not limited to chemical etching, lapping/polishing, reactive ion etching, and ion milling. The method of removing sacrificial host substrate 140 is not critical. Conventional photolithographic, etching, and deposition techniques may then be used to form contacts 118 and 120 to complete light-emitting device 142 (FIG. 5D).

Figure 6A:
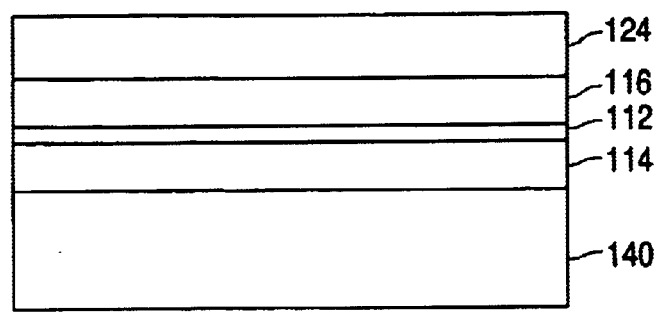
FIGS. 6A–6D schematically illustrate another method of fabricating a light-emitting device in accordance with another embodiment.
Figure 6B:
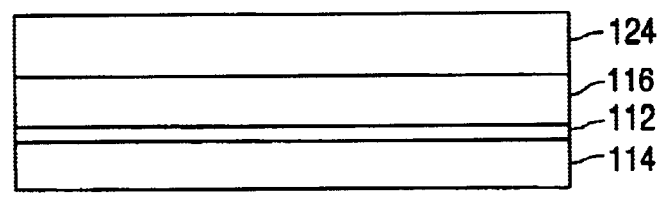
Figure 6C:
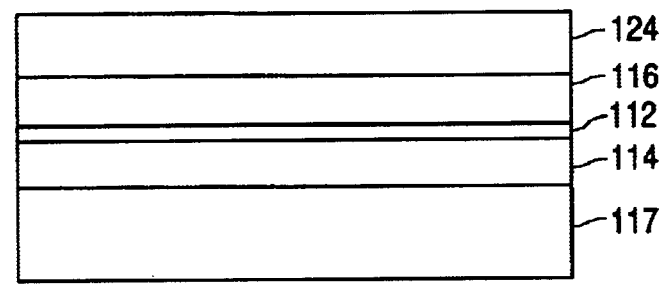
Figure 6D:
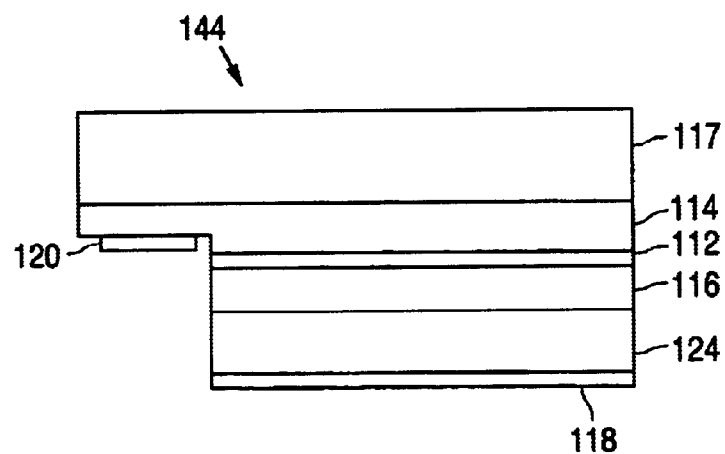

In the method just described, sacrificial substrate 140 is removed after superstrate 117 is attached to stack 110. In a method illustrated in FIGS. 6A–6D, sacrificial substrate 140 is removed before superstrate 117 is attached. Referring to FIG. 6A, as in the previous method active region 112 and regions 114 and 116 are formed on sacrificial substrate 140. Additional layer 124 may also be formed at this time. Sacrificial substrate 140 may then be removed (FIG. 6B) and superstrate 117 (FIG. 6C) may be attached by bonding or grown by conventional deposition techniques as described above (including techniques utilizing graded composition lattice-matching layers). Although in FIGS. 6C and 6D superstrate 117 is shown attached to semiconductor region 114, in other embodiments superstrate 117 may be attached instead to layer 124. Layer 124 may provide mechanical support for stack 110 during the removal of substrate 140 and during attachment of superstrate 117. Conventional photolithographic, etching, and deposition techniques may then be used to form contacts 118 and 120 to complete light-emitting device 144 (FIG. 6D).

In another method of fabricating light-emitting devices such as those disclosed above, stack 110 is grown on superstrate 117 rather than on host substrate 140. An optional composition graded layer may be grown on superstrate 117 (before the growth of stack 110) to enable lattice-matched or nearly lattice-matched growth of stack 110 despite a lattice mismatch between superstrate 117 and stack 110. The composition graded layer, which is typically selected to be substantially transparent to light emitted by active region 112, may take the place of bonding layers 126 of FIG. 2A, for example. In one embodiment, for example, a graded composition AlGaInP layer is grown on a substantially transparent superstrate formed from GaP. A stack of layers including a III-Phosphide based active region is subsequently grown on the graded composition layer. The composition of the graded layer varies such that the layer is substantially lattice-matched to both the superstrate and the stack of layers. This method does not require the use of a sacrificial host substrate.

FIGS. 5A–5D show superstrate 117 grown on or bonded to a stack 110 in an individual device. One of ordinary skill in the art will recognize, however, that attachment of superstrate 117 to stack 110 may occur at the device level (after dicing) or at the wafer level (before dicing), depending on the manufacturing flow.

Referring again to FIGS. 2A and 3A, for example, superstrate 117 and layers in stack 110 may be formed from materials having a relatively high index of refraction. In such embodiments, some of the light emitted by active region 112 may be trapped in light-emitting device 100 by total internal reflection at interfaces between, for example, superstrate 117 and air or between superstrate 117 and a low refractive index material (not shown) encapsulating light-emitting device 100.

Figure 7A:
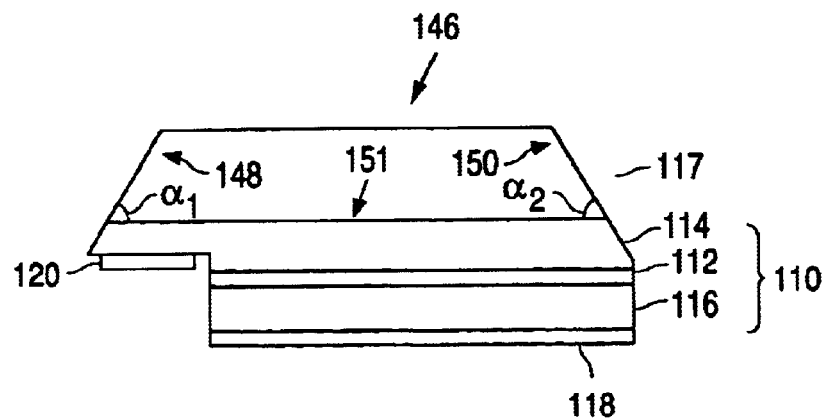
FIGS. 7A–7F schematically illustrate embodiments in which superstrates are shaped or interfaces are textured to increase light extraction efficiency.
Figure 7B:
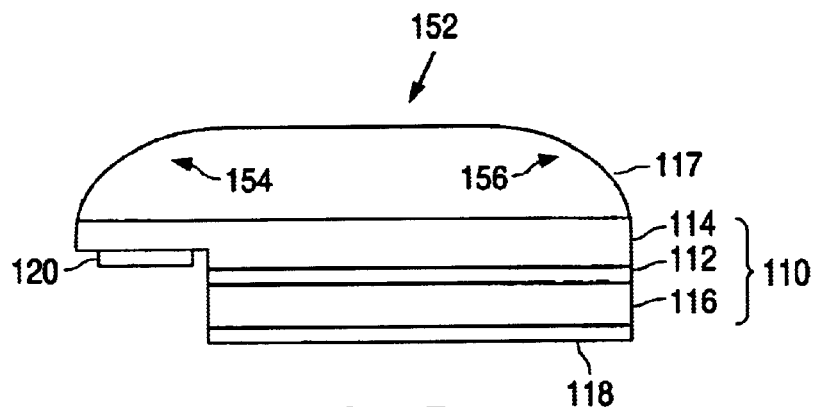

In some embodiments, portions of the light-emitting device are shaped to reduce trapping of light by total internal reflection. In the embodiment illustrated in FIG. 7A, for example, light-emitting device 146 includes superstrate 117 having surfaces 148 and 150 which form acute angles $\alpha_1$ and $\alpha_2$ with a top surface 151 of stack 110. Such angled surfaces may be formed, for example, by dicing a wafer into separate devices with a beveled or angled saw blade. Similarly, in another embodiment (FIG. 7B) light-emitting device 152 includes a superstrate 117 having curved surfaces 154 and 156. These surfaces may also be formed, for example, by dicing with an appropriately shaped saw blade, or by etching or milling or by a combination of such techniques. The shapes of the superstrates in light-emitting devices 146 and 152 may approximate the shape of, for example, a dome or a hemisphere. Hence, in these embodiments more of the light emitted by active region 112 is incident on interfaces between the superstrate and the external environment at angles close to normal incidence than is the case for a superstrate having a cubic or rectangular prism shape as in FIG. 1. Consequently, light may be extracted more efficiently from light-emitting devices 146 and 152 than from light-emitting device 100 since the fraction of emitted light trapped in devices 146 and 152 by total internal reflection may be reduced compared to that for device 100.

Figure 7C:
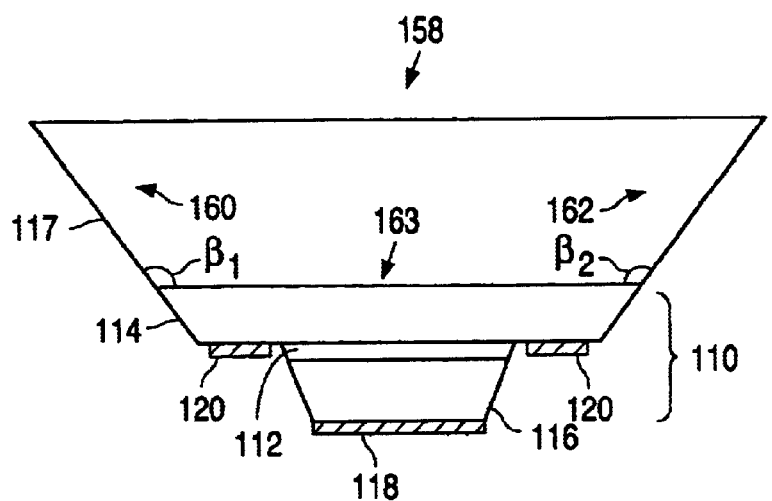

In another embodiment (FIG. 7C), light-emitting device 158 includes superstrate 117 having surfaces 160 and 162 which form obtuse angles $\beta_1$ and $\beta_2$ with a top surface 163 of stack 110. A similarly shaped III-Phosphide based flip chip is disclosed in U.S. Pat. No. 6,229,160 (see FIG. 11 of that reference, for example), in which the superstrate shape of this embodiment is shown to enhance the efficiency with which light is extracted from the device.

Figure 7D:
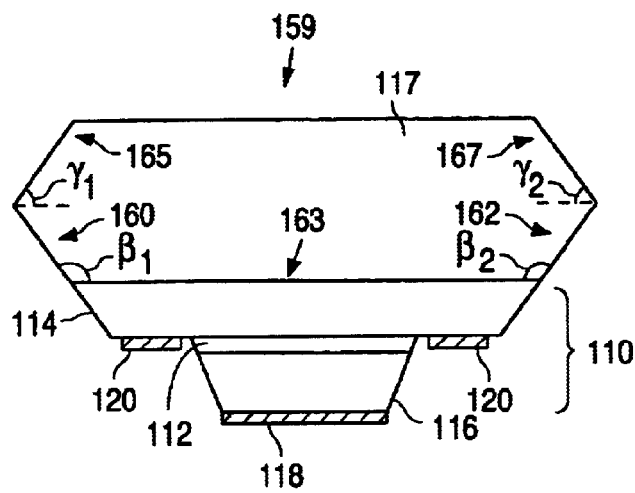

In another embodiment (FIG. 7D), light-emitting device 159 includes superstrate 117 having, in addition to obtusely angled surfaces 160 and 162, surfaces 165 and 167 forming acute angles $\gamma_1$ and $\gamma_2$ with surface 163. The shape of light-emitting device 159, which may be formed with two sawing steps, for example, may combine the light extraction advantages of the embodiments shown in FIGS. 7A and 7C. In other implementations, a light-emitting device having a substantially hexagonal cross-section as shown in FIG. 7D, for example, may be formed with its active region located approximately at its widest point.

Figure 7E:
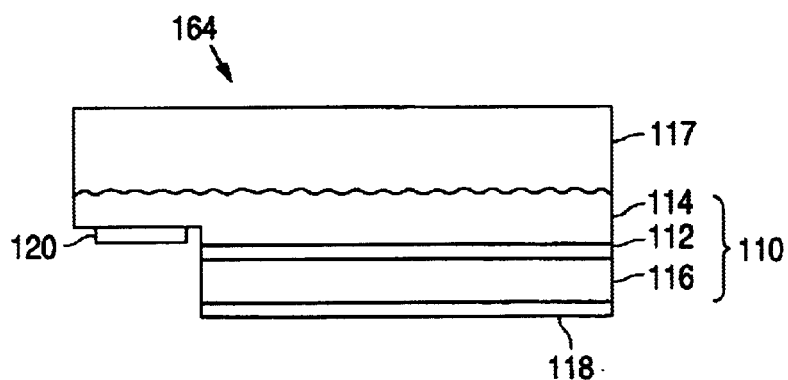
Figure 7F:
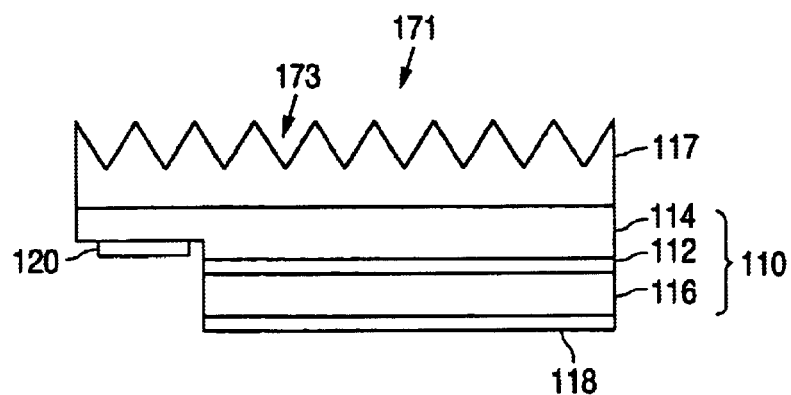

The extraction efficiency of the light-emitting devices shown in FIGS. 7A–7D may be optimized, for example, by varying the thickness of superstrate 117 and by varying the bevel angles (e.g., $\alpha_1$, $\alpha_2$, $\beta_1$, $\beta_2$, $\gamma_1$, and $\gamma_2$) of the surfaces of superstrate 117 or by otherwise varying the shape of its surface. Although surfaces 148, 150, 154, 156, 160, 162, 165, and 167 are shown as sides in FIGS. 7A–7D, these surfaces may be located anywhere on the device. For example, the top surface of light-emitting device 171 (FIG. 7F) is shaped by grooves 173 formed, for example, with a beveled or angled saw blade. Although grooves 173 are shown as having triangular profiles, other implementations may employ grooves having other shapes such as square grooves or grooves having sides inclined toward each other so that individual grooves are narrower at the top than at the bottom. These may be formed by wet (crystallographic) etching techniques.

In other embodiments, the light extraction efficiency of the light-emitting device is improved by the inclusion of one or more interfaces that are roughened or textured to scatter light out of the device. In light-emitting device 164 (FIG. 7E), for example, the interface between superstrate 117 and semiconductor region 114 is roughened. Other interfaces in light-emitting device 164 may also be roughened instead of or in addition to that shown in FIG. 7E. Such roughened interfaces may be produced, for example, by etching, sawing, or milling.

Roughened interfaces may also be produced by patterned semiconductor bonding in which cavities are formed at the bonded interface and serve as scattering centers as described in U.S. Pat. Nos. 5,793,062 and 6,015,719, both of which are incorporated herein by reference in their entirety. These techniques may also be combined with photolithographic techniques. Roughened interfaces are also disclosed in U.S. Pat. No. 5,779,924, incorporated herein by reference in its entirety.

Figure 8:
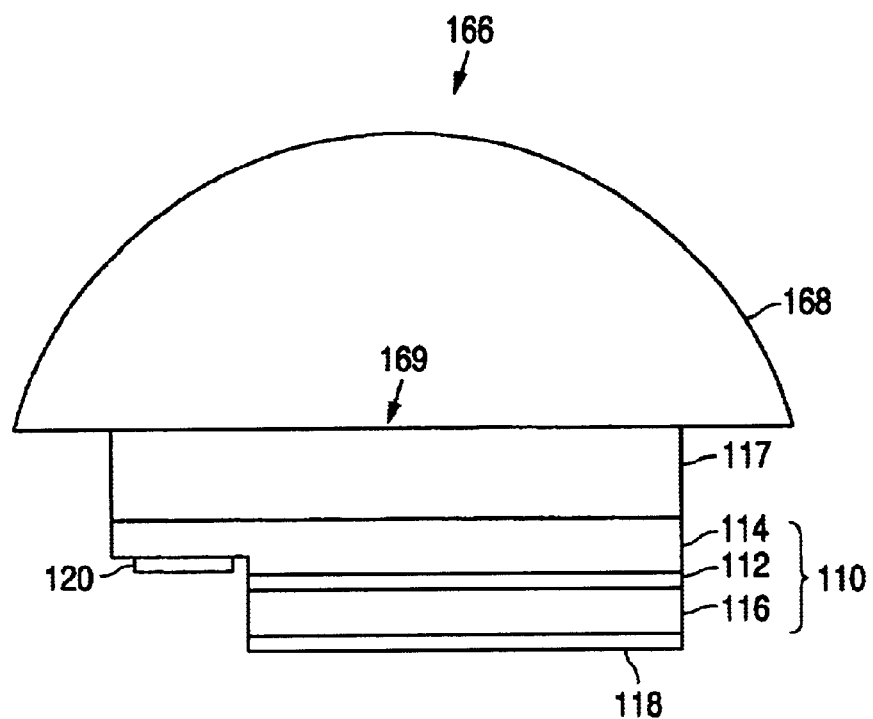
FIG. 8 schematically illustrates a light-emitting device including a lens in accordance with another embodiment of the present invention.

In another embodiment (FIG. 8), the light extraction efficiency of a light-emitting device 166 is improved by attaching a lens 168 to surface 169 of superstrate 117. Attachment of lens 168 may be accomplished, for example, by bonding as described in U.S. patent application Ser. No. 09/660,317, assigned to the assignee of the present invention and incorporated herein by reference in its entirety. The angles of incidence at the curved surface of lens 168 for light entering the lens from superstrate 117 more closely approach normal incidence as the size of lens 168 is increased. Hence, it may be advantageous for the base of lens 168 (the flat surface) to be larger than surface 169 of superstrate 117 to which the lens is attached. In some embodiments, superstrate 117 is absent and lens 166 is attached to stack 110.

Conventional light-emitting devices are typically encapsulated in a low refractive index encapsulating material such as epoxy, for example, to improve light extraction efficiency. The embodiments shown in FIGS. 7A–7D and 8 may eliminate the need for such an encapsulant. Eliminating the encapsulant may allow for higher input electrical power and higher flux output without degradation of the device.

Another advantage of the III-Phosphide and III-Arsenide light-emitting devices disclosed herein is that they may be optically, mechanically, and electrically compatible with III-Nitride based flip chips such as those disclosed in U.S. patent application Ser. No. 09/469,657. Consequently, the disclosed light-emitting devices may be easily and conveniently included in arrays with such III-Nitride flip chips. For example, in some embodiments light-emitting devices disclosed herein and III-Nitride flip chips may be mounted to a common substrate, submount, or heat sink with the same die-attach apparatus or with similar die-attach apparatus. This simplifies assembly of such an array. In addition, in some embodiments some of the optical characteristics (e.g., angular distribution of emitted light, output power) of devices disclosed herein and of III-Nitride flip-chips are substantially similar. This may allow simplification of the design of an optical system handling light output by such an array.

Figure 9:
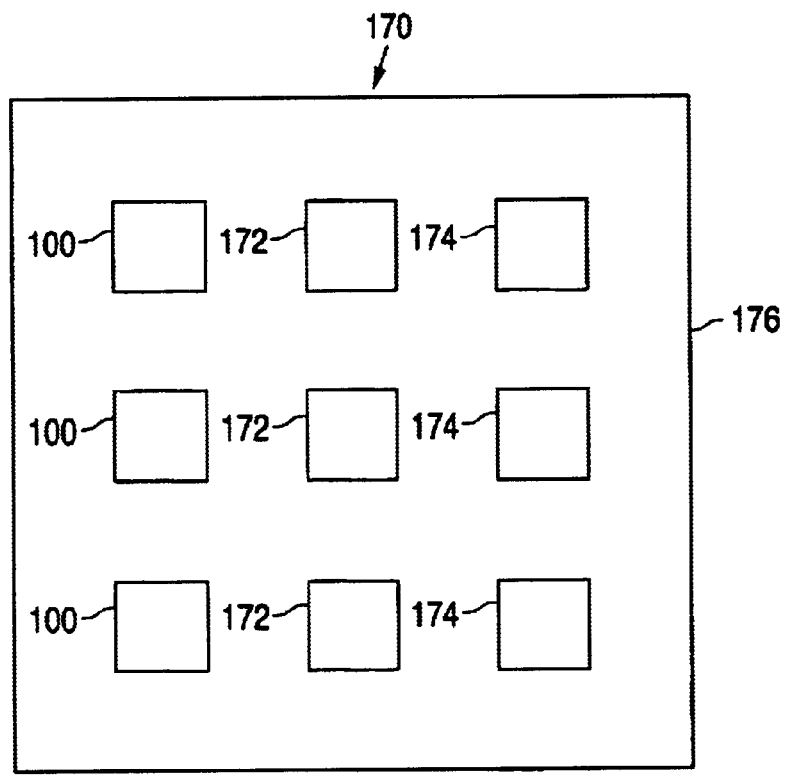
FIG. 9 schematically illustrates in a top view an array of light-emitting diodes in accordance with another embodiment.

Referring to FIG. 9, for example, in one embodiment an array 170 includes a plurality of light-emitting devices 100 (which may emit red, amber, or green light, for example, depending on the composition of their active regions), a plurality of green light-emitting III-Nitride devices 172, and a plurality of blue light-emitting III-Nitride devices 174 disposed on a substrate 176 (such as a printed circuit board, high thermal conductivity ceramic, or silicon substrate). In one implementation, all of the light-emitting devices in array 170 are mounted as flip chips. These flip chips may be attached to substrate 176 either directly or via submounts (as shown in FIG. 4, for example) disposed on substrate 176. Substrate 176 typically includes conductive traces which supply electrical power to the light emitting devices, and may optionally include additional circuitry such as, for example, circuitry to protect the light-emitting devices from electrostatic discharges. In other implementations, some of the light-emitting devices in the array are not mounted as flip chips. Also, in some implementations other III-Phosphide and III-Arsenide light-emitting devices disclosed herein may be substituted for light-emitting devices 100. One of ordinary skill in the art will recognize that, for example, red, green, and blue emission or blue and amber emission from the light-emitting devices in array 170 may be combined to provide apparently white light. Other combinations of colors emitted by light-emitting devices in array 170 may also provide apparently white light.

Arrays in other embodiments may include more or fewer colors of light-emitting devices than shown in FIG. 9. For example, in some embodiments devices 172 and/or devices 174 may not be present. Also, in other embodiments the light-emitting devices in an array may be arranged in a pattern differing from that shown in FIG. 9. Such arrays of flip-chip mounted red, amber, green, and blue light-emitting devices may be advantageously employed, for example, in various high power display and lighting applications which require multiple colors and/or white light. Arrays in yet other embodiments can also incorporated one or more luminescent materials that converts the wavelengths of light emitted by one or more light-emitting devices of the array to other wavelengths. In another implementation a coating on the top surface of superstrate 117, for example, includes a luminescent material. The luminescent material includes, for example, conventional phosphor particles, organic semiconductors, II–VI or III–V semiconductors, II–VI or III–V semiconductor quantum dots or nanocrystals, dyes, polymers, and materials such as GaN that luminesce from defect centers. Such luminescent coatings may be implemented, for example, as disclosed in U.S. patent application Ser. No. 09/827,382, assigned to the assignee of the present invention and incorporated herein by reference in its entirety.

While the present invention is illustrated with particular embodiments, the invention is intended to include all variations and modifications falling within the scope of the appended claims.

We claim:

1. A light-emitting semiconductor device comprising:
   a stack of layers including an active region, said active region comprising a semiconductor selected from the group consisting of III-Phosphides, III-Arsenides, and alloys thereof;
   a superstrate disposed on a first side of said stack, said superstrate substantially transparent to light emitted by said active region;
   a first electrical contact and a second electrical contact electrically coupled to apply a voltage across said active region, said first electrical contact and said second electrical contact disposed on a second side of said stack opposite to said first side.

2. The light-emitting semiconductor device of claim 1, wherein a larger fraction of light emitted by said active region exits said stack through said first side than through said second side.

3. The light-emitting semiconductor device of claim 1, wherein said superstrate is formed from a material having a refractive index greater than about 1.8 at a wavelength of light emitted by said active region.

4. The light-emitting semiconductor device of claim 1, wherein said superstrate has a resistivity greater than about 0.05 Ohm-centimeters.

5. The light-emitting semiconductor device of claim 1, wherein said superstrate is formed from a semiconductor material.

6. The light-emitting semiconductor device of claim 5, wherein said superstrate is formed from a semiconductor material selected from the group consisting of III-Phosphides, III-Arsenides, II–VI semiconductors, and SiC.

7. The light-emitting semiconductor device of claim 5, wherein said semiconductor material is GaP.

8. The light-emitting device of claim 5, wherein said semiconductor material is undoped.

9. The light-emitting device of claim 1, wherein said superstrate is formed from a dielectric material.

10. The light-emitting device of claim 9, wherein said dielectric material is selected from diamond, yttrium aluminum garnet, metal oxides, metal fluorides, optical glasses, chalcogenide glasses, phosphides, arsenides, and nitrides.

11. The light-emitting device of claim 9, wherein said dielectric material comprises sapphire.

12. The light-emitting device of claim 1, wherein said superstrate has a surface that forms an acute angle with said first side of said stack.

13. The light-emitting device of claim 1, wherein said superstrate has a surface that forms an obtuse angle with said first side of said stack.

14. The light-emitting device of claim 1, wherein said superstrate has a curved surface.

15. The light-emitting device of claim 1, further comprising a bonded interface disposed between said active region and said superstrate.

16. The light-emitting device of claim 15, wherein said superstrate is directly bonded to a semiconductor layer included in said stack.

17. The light-emitting device of claim 1, further comprising at least one bonding layer disposed between said active region and said superstrate.

18. The light-emitting device of claim 1, wherein said bonding layer is formed from a material having a refractive index greater than about 1.5 at a wavelength of light emitted by said active region.

19. The light-emitting device of claim 1, wherein at least one of said electrical contacts is highly reflective to light emitted by said active region.

20. The light-emitting device of claim 19, wherein said one of said electrical contacts comprises:
 a patterned semiconductor layer disposed on portions of said second side of said stack;
 a plurality of ohmic contacts disposed on said patterned semiconductor layer; and
 a reflective metal layer disposed on portions of said second side of said stack not covered by said patterned semiconductor layer.

21. The light-emitting device of claim 1, wherein said first electrical contact surrounds said second electrical contact.

22. The light-emitting device of claim 1, further comprising at least one layer highly reflective to light emitted by said active region located to reflect said light toward said superstrate.

23. The light-emitting device of claim 1, further comprising an interface textured to scatter light emitted by said active region.

24. The light-emitting device of claim 1, further comprising a lens attached to said superstrate.

25. The light-emitting device of claim 1, wherein an area of said active region is greater than about 0.2 square millimeters.

26. The light-emitting device of claim 1, wherein an area of said active region is greater than about 1.0 square millimeters.

27. The light-emitting device of claim 1, wherein said stack of layers, said superstrate, and said electrical contacts are configured to allow said light-emitting semiconductor device to operate at an input power exceeding 0.5 Watts.

28. The light-emitting device of claim 1, further comprising a composition graded layer disposed between said superstrate and said stack, wherein the composition graded layer is substantially lattice matched to said superstrate in a portion of the composition graded layer closest to said superstrate and substantially lattice matched to said stack in a portion of composition graded layer closest to said stack.

29. An array of light-emitting devices comprising:
 a substrate having a surface; and
 a plurality of light-emitting semiconductor devices, each of which comprises a stack of semiconductor layers including an active region, a superstrate disposed on a first side of said stack and substantially transparent to light emitted by said active region, and a first electrical contact and a second electrical contact disposed on a second side of said stack opposite to said first side, said light-emitting semiconductor devices disposed above said surface of said substrate with their superstrates facing away from said substrate;
 wherein said active regions of at least a subset of said light-emitting semiconductor devices include a semiconductor selected from the group consisting of III-Phosphides, III-Arsenides, and alloys thereof.

30. The array of claim 29, wherein at least a subset of said light-emitting semiconductor devices emits red light.

31. The array of claim 29, wherein at least a subset of said light-emitting semiconductor devices emits amber light.

32. The array of claim 29, wherein at least a subset of said light-emitting semiconductor devices emits green light.

33. The array of claim 29, wherein at least a subset of said light-emitting semiconductor devices emits blue light.

34. The array of claim 29, wherein said active regions of said light-emitting semiconductor devices that emit blue light include a III-Nitride semiconductor.

35. The array of claim 29, wherein light emitted by said light-emitting devices combine to produce white light.

36. The array of claim 29, wherein at least a subset of said light-emitting semiconductor devices are coated with one or more luminescent materials that convert light of a wavelength emitted by said active regions to at least another wavelength.

37. The light-emitting semiconductor device of claim 1, wherein said superstrate is at least 25 $\mu$m thick.

38. The light-emitting semiconductor device of claim 1, wherein the superstrate has a thickness between about 25 $\mu$m and about 1000 $\mu$m.

39. A light-emitting semiconductor device comprising:
 a stack of layers including an active region, said active region comprising a semiconductor selected from the group consisting of III-Phosphides, III-Arsenides, and alloys thereof;
 a superstrate disposed on a first side of said stack, wherein said superstrate provides mechanical stability to the device and is substantially transparent to light emitted by said active region; and a first electrical contact and a second electrical contact electrically coupled to apply a voltage across said active region, said first electrical contact and said second electrical contact disposed on a second side of said stack opposite to said first side.

40. The light-emitting device of claim 39, wherein an area of said active region is greater than about 0.2 square millimeters.

41. The light-emitting device of claim 39, wherein an area of said active region is greater than about 1.0 square millimeters.

42. The light-emitting device of claim 37, wherein said stack of layers, said superstrate, and said electrical contacts are configured to allow said light-emitting semiconductor device to operate at an input power exceeding 0.5 Watts.

43. A light-emitting semiconductor device comprising:
   a stack of layers including an active region, said active region comprising a semiconductor selected from the group consisting of III-Phosphides, III-Arsenides, and alloys thereof;
   a superstrate disposed on a first side of said stack, wherein said superstrate has a thickness between about 2 mils and about 15 mils and is substantially transparent to light emitted by said active region; and
   a first electrical contact and a second electrical contact electrically coupled to apply a voltage across said active region, said first electrical contact and said second electrical contact disposed on a second side of said stack opposite to said first side.

44. The light-emitting semiconductor device of claim 43, wherein a larger fraction of light emitted by said active region exits said stack through said first side than through said second side.

45. The light-emitting semiconductor device of claim 43, wherein said superstrate is not conductive.

46. The light-emitting semiconductor device of claim 43, wherein said superstrate is formed from a semiconductor material.

47. The light-emitting semiconductor device of claim 46, wherein said semiconductor material is GaP.

48. The light-emitting device of claim 46, wherein said semiconductor material is undoped.

49. The light-emitting device of claim 43, wherein said superstrate has a surface that forms an obtuse angle with said first side of said stack.

50. The light-emitting device of claim 43, wherein said superstrate has a curved surface.

51. The light-emitting device of claim 43, further comprising a bonded interface disposed between said active region and said superstrate.

52. The light-emitting device of claim 51, wherein said superstrate is directly bonded to a semiconductor layer included in said stack.

53. The light-emitting device of claim 43, further comprising at least one bonding layer disposed between said active region and said superstrate.

54. The light-emitting device of claim 43, wherein at least one of said electrical contacts is highly reflective to light emitted by said active region.

55. The light-emitting device of claim 43, wherein said first electrical contact surrounds said second electrical contact.

56. The light-emitting device of claim 43, further comprising at least one layer highly reflective to light emitted by said active region located to reflect said light toward said superstrate.

* * * * *

UNITED STATES PATENT AND TRADEMARK OFFICE
CERTIFICATE OF CORRECTION

PATENT NO. : 6,784,463 B2  Page 1 of 1
DATED : August 31, 2004
INVENTOR(S) : Michael D. Camras et al.

It is certified that error appears in the above-identified patent and that said Letters Patent is hereby corrected as shown below:

Title page,
Item [54], Title, cancel "PHOSPIDE" and substitute -- PHOSPHIDE --.

Column 17,
Line 12, cancel "37," and insert -- 39, --.

Signed and Sealed this

Thirtieth Day of November, 2004

JON W. DUDAS
*Director of the United States Patent and Trademark Office*